United States Patent
Ouyang et al.

(10) Patent No.: US 11,752,950 B2
(45) Date of Patent: Sep. 12, 2023

(54) FOLDABLE AUTOMOTIVE DISPLAY DEVICE AND VEHICLE

(71) Applicant: WUHAN CHINA STAR OPTOELECTRONICS SEMICONDUCTOR DISPLAY TECHNOLOGY CO., LTD., Hubei (CN)

(72) Inventors: Qi Ouyang, Hubei (CN); Mugyeom Kim, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 419 days.

(21) Appl. No.: 16/955,599

(22) PCT Filed: Apr. 28, 2020

(86) PCT No.: PCT/CN2020/087422
§ 371 (c)(1),
(2) Date: Jun. 18, 2020

(87) PCT Pub. No.: WO2021/159610
PCT Pub. Date: Aug. 19, 2021

(65) Prior Publication Data
US 2022/0144184 A1 May 12, 2022

(30) Foreign Application Priority Data
Feb. 10, 2020 (CN) .......................... 202010084040.4

(51) Int. Cl.
*B60R 11/02* (2006.01)
*B60J 3/02* (2006.01)
(Continued)

(52) U.S. Cl.
CPC ......... *B60R 11/0229* (2013.01); *B60J 3/0204* (2013.01); *H05K 5/0017* (2013.01);
(Continued)

(58) Field of Classification Search
None
See application file for complete search history.

(56) References Cited

U.S. PATENT DOCUMENTS

2015/0361696 A1   12/2015   Tazbaz

FOREIGN PATENT DOCUMENTS

| CN | 2560986 Y | 7/2003 |
|----|-----------|--------|
| CN | 203573594 U | 4/2014 |

(Continued)

*Primary Examiner* — Ashok Patel
(74) *Attorney, Agent, or Firm* — PV IP PC; Wei Te Chung; Zhigang Ma

(57) ABSTRACT

The present invention provides a foldable automotive display device and a vehicle. The display device of the present invention is used for being fixed in a carriage, the display device includes a folded portion and a plurality of unfolded portions located on both sides of the folded portion, two adjacent unfolded portions are rotatably connected by a rotating component, and the rotating component is disposed corresponding to the folded portion. One unfolded portion is used for being fixed on the carriage, and the others fold or unfold the display device by the rotating component.

13 Claims, 4 Drawing Sheets

(51) Int. Cl.
    *H05K 5/00*           (2006.01)
    *G09F 21/04*         (2006.01)
    *G09F 9/30*           (2006.01)
    *H05K 5/02*           (2006.01)
    *B60R 11/00*         (2006.01)

(52) U.S. Cl.
    CPC .... *H05K 5/0226* (2013.01); *B60R 2011/0003* (2013.01); *B60R 2011/0085* (2013.01); *G09F 9/301* (2013.01); *G09F 21/049* (2020.05)

(56) References Cited

FOREIGN PATENT DOCUMENTS

| | | | |
|---|---|---|---|
| CN | 103780720 | A | 5/2014 |
| CN | 204143107 | U | 2/2015 |
| CN | 205854035 | U | 1/2017 |
| CN | 106462194 | A | 2/2017 |
| CN | 206788691 | U | 12/2017 |
| CN | 207067960 | U | 3/2018 |
| CN | 207268852 | U | 4/2018 |
| CN | 108762394 | A | 11/2018 |
| CN | 208530450 | U | 2/2019 |
| CN | 110718155 | A | 1/2020 |
| JP | H0844301 | A | 2/1996 |
| JP | H11153962 | A | 6/1999 |
| JP | 2008143397 | A | 6/2008 |
| KR | 20170026021 | * | 3/2017 |
| KR | 20210052708 | * | 5/2021 |

\* cited by examiner

FOLDABLE AUTOMOTIVE DISPLAY DEVICE AND VEHICLE

CROSS REFERENCE TO RELATED APPLICATIONS

The application claims priority to a Chinese patent application filed on Feb. 10, 2020 with the National Intellectual Property Administration, having application number 202010084040.4, titled "Foldable Automotive Display Device and Vehicle", which is incorporated by reference in the present application in its entirety.

FIELD OF INVENTION

The present disclosure relates to the field of display technology, and more particularly, to a foldable automotive display device and a vehicle.

BACKGROUND OF INVENTION

Vehicles are tools for people to travel with. With development of transportation, vehicles account for an increasing proportion of human transportation. As a focus of human-computer interaction, display devices will play an increasingly important role in smart vehicles. Display screens in traditional vehicles have been statically installed in an instrument panel of the vehicles. Due to different display effects of the display screens observed at different locations, and an influence of strong external light and other factors, the display effects of automotive display devices are often poor. Moreover, with continuous development of automotive industry, traditional automotive display screens are not suitable for a plurality of driving modes.

Thus, current technology has defects and needs improvement.

SUMMARY OF INVENTION

The present disclosure provides a foldable automotive display device and a vehicle to solve the problem of a poor display effect of current automotive display devices.

In order to solve the above problem, technical solutions provided by the present disclosure are as follows.

The present disclosure provides a foldable automotive display device. The display device is used for being fixed in a carriage, and the display device comprises a folded portion and a plurality of unfolded portions located on both sides of the folded portion. The two adjacent unfolded portions are rotatably connected by a rotating component, and the rotating component is disposed corresponding to the folded portion. One unfolded portion is used for being fixed on the carriage, and the others fold or unfold the display device by the rotating component.

In the foldable automotive display device of the present disclosure, the display device at least comprises a first unfolded portion and a second unfolded portion, the first unfolded portion is attached on the carriage, the second unfolded portion rotates around the rotating component within a rotation range from 0° to 180°, and the second unfolded portion is fixed at any angle within the rotation range.

In the foldable automotive display device of the present disclosure, the display device comprises two rotating components arranged in parallel, a first rotating component is located between the first unfolded portion and the second unfolded portion, a second rotating component is located on a side of the first unfolded portion away from the second unfolded portion, and the display device is rotatably connected to the carriage by the second rotating component.

In the foldable automotive display device of the present disclosure, a light-blocking component is disposed on edges of both sides of the display device perpendicular to the rotating component respectively, an end of the light-blocking component is connected to the first unfolded portion, an opposite end is connected to the second unfolded portion on a same side, and the light-blocking component unfolds as the display device unfolds, or folds as the display device folds.

In the foldable automotive display device of the present disclosure, a storage groove is defined on both sides of the first unfolded portion comprising the light-blocking component. When the display device is in a folded state, the light-blocking component is stored in the storage groove; and when the display device is in an unfolded state, the light-blocking component is pulled out from the storage groove.

In the foldable automotive display device of the present disclosure, the light-blocking component is a light-blocking net or a light-blocking plate.

In the foldable automotive display device of the present disclosure, the light-blocking component is a Z-shaped folded structure, a sliding folded structure, or a telescopic folded structure.

In the foldable automotive display device of the present disclosure, the carriage comprises a console and a sun visor, the display device is disposed on the console and located under the sun visor, and when the display device is in an unfolded state, the sun visor is configured to splice with the display device by turning over.

The present disclosure provides a vehicle with the above foldable automotive display device.

In order to solve the above problem, technical solutions further provided by the present disclosure are as follows.

The present disclosure provides a foldable automotive display device. The display device is used for being fixed in a carriage, and the display device comprises a folded portion and a plurality of unfolded portions located on both sides of the folded portion. The two adjacent unfolded portions are rotatably connected by a rotating component, and the rotating component is disposed corresponding to the folded portion. One unfolded portion is used for being fixed on the carriage, and the others fold or unfold the display device by the rotating component. Wherein, the display device comprises a case and a display screen attached to a surface of the case, and the display screen is disposed corresponding to the folded portion and the unfolded portions.

In the foldable automotive display device of the present disclosure, the display device at least comprises a first unfolded portion and a second unfolded portion, the first unfolded portion is attached on the carriage, the second unfolded portion rotates around the rotating component within a rotation range from 0° to 180°, and the second unfolded portion is fixed at any angle within the rotation range.

In the foldable automotive display device of the present disclosure, the display device comprises two rotating components arranged in parallel, a first rotating component is located between the first unfolded portion and the second unfolded portion, a second rotating component is located on a side of the first unfolded portion away from the second unfolded portion, and the display device is rotatably connected to the carriage by the second rotating component.

In the foldable automotive display device of the present disclosure, a light-blocking component is disposed on edges of both sides of the display device perpendicular to the rotating component respectively, an end of the light-blocking component is connected to the first unfolded portion, an opposite end is connected to the second unfolded portion on a same side, and the light-blocking component unfolds as the display device unfolds, or folds as the display device folds.

In the foldable automotive display device of the present disclosure, a storage groove is defined on both sides of the first unfolded portion comprising the light-blocking component. When the display device is in a folded state, the light-blocking component is stored in the storage groove; and when the display device is in an unfolded state, the light-blocking component is pulled out from the storage groove.

In the foldable automotive display device of the present disclosure, the light-blocking component is a light-blocking net or a light-blocking plate.

In the foldable automotive display device of the present disclosure, the light-blocking component is a Z-shaped folded structure, a sliding folded structure, or a telescopic folded structure.

In the foldable automotive display device of the present disclosure, the carriage comprises a console and a sun visor, the display device is disposed on the console and located under the sun visor, and when the display device is in an unfolded state, the sun visor is configured to splice with the display device by turning over.

Beneficial effects of the present disclosure is that the present disclosure provides the foldable automotive display device and the vehicle. On the one hand, foldable organic light-emitting diode (OLED) display screens are applied in automotive display, and a display effect of the automotive display is improved compared to traditional foldable liquid crystal display (LCD) display screens. On the other hand, the light-blocking component is disposed in the foldable automotive display device in the present disclosure, which can effectively block external light from irradiating a display region of the display device, and effectively prevent the display effect of the display device from adverse effects caused by the external light, thereby improving the display effect of the automotive display.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers.

The present disclosure is directed to the technical problem of poor display effect caused by external light in current automotive display devices, and the present disclosure can solve the defects.

Figure 1:
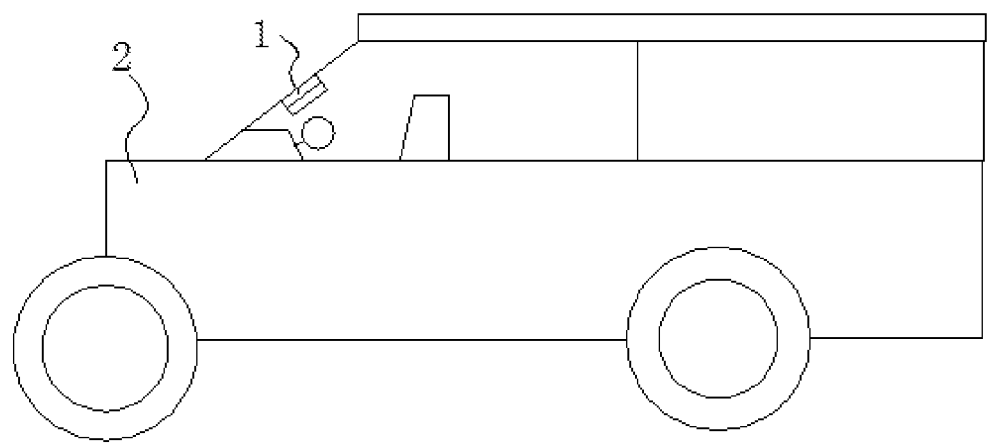
FIG. 1 is a schematic structural diagram of a vehicle with a foldable automotive display device provided by the present disclosure.
Figure 2:
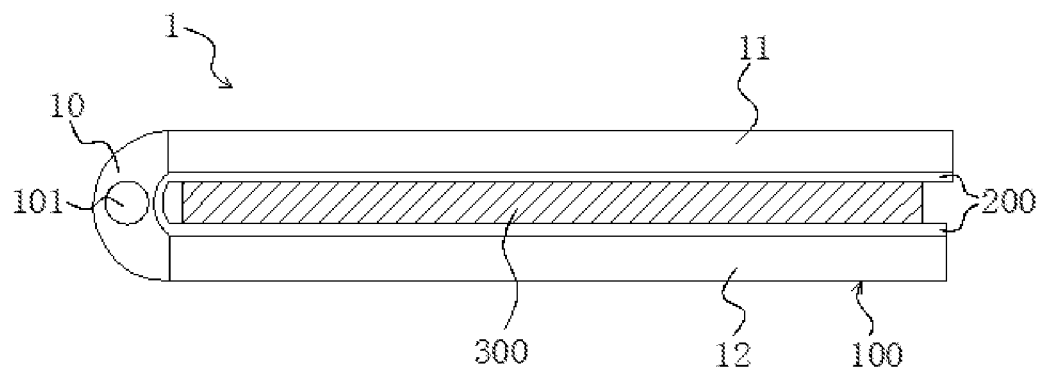
FIG. 2 is a first side view of a folded state of the foldable automotive display device provided by the present disclosure.
Figure 3:
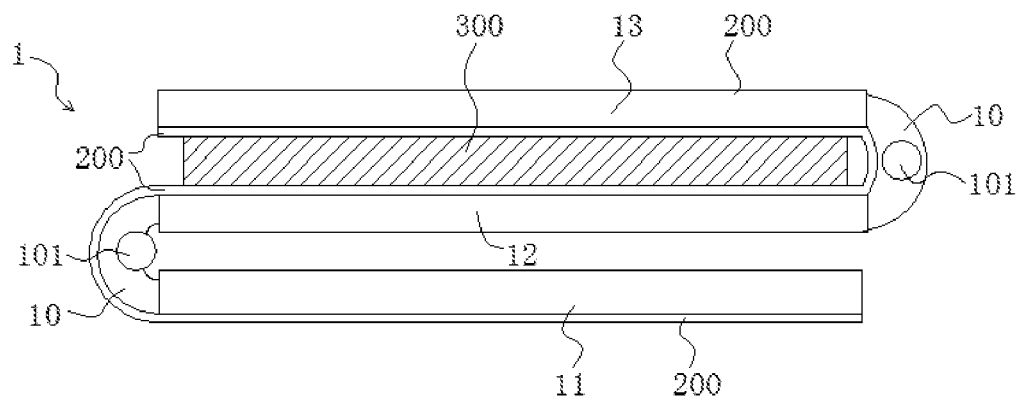
FIG. 3 is a second side view of the folded state of the foldable automotive display device provided by the present disclosure.

As shown in FIG. 1 to FIG. 3, the present disclosure provides a foldable automotive display device. The display device 1 is used for being fixed in a carriage 2, and the display device 1 comprises a folded portion 10 and a plurality of unfolded portions (11, 12, and 13) located on both sides of the folded portion 10. A rotating component 101 is disposed on the folded portion 10, and the two adjacent unfolded portions are rotatably connected by one rotating component 101. Wherein, one unfolded portion is used for being fixed on the carriage 2, and the others fold or unfold the display device 1 by the rotating component 101.

Specifically, referring to FIG. 2, FIG. 2 is a first side view of a folded state of the foldable automotive display device provided by the present disclosure. The display device 1 comprises a first unfolded portion 11 and a second unfolded portion 12 located on both sides of the folded portion 10, the first unfolded portion 11 is attached on the carriage 2, and the second unfolded portion 12 rotates around the rotating component 101 within a rotation range from 0° to 180°.

Wherein, the rotating component 101 may be a rotating shaft, but not limited herein. The second unfolded portion 12 is fixed at any angle within the rotation range through a cooperation between the first unfolded portion 11, the second unfolded portion 12, and the rotating component 101, or a limiting structure on the display device, that is, the folded state can be automatically locked.

The display device 1 comprises a case 100 and a display screen 200 attached to a surface of the case 100, and the display screen 200 is an organic light-emitting diode (OLED) display screen. The display screen 200 is disposed corresponding to the folded portion 10 and the unfolded portions (11 and 12). Meanwhile, all the folded portion 10 and the unfolded portions (11 and 12) are configured to display, and a display effect is better than a liquid crystal display (LCD) display screen.

A light-blocking component 300 is disposed on edges of both sides of the display device 1 perpendicular to the rotating component 101 respectively, an end of the light-blocking component 300 is connected to the first unfolded portion 11, an opposite end is connected to the second unfolded portion 12 on a same side, and the light-blocking component 300 stretches or retracts as the second unfolded portion 12 moves relative to the first unfolded portion 11. The light-blocking component 300 is configured to block external light irradiated to the display screen 200 from both sides of the display device 1.

Refer to FIG. 3, FIG. 3 is a second side view of the folded state of the foldable automotive display device provided by the present disclosure. Compared to the above first foldable automotive display device, the display device 1 at least comprises two folded portions 10, and the two folded portions 10 are arranged in parallel. The display device 1 further comprises the first unfolded portion 11, the second unfolded portion 12, and a third unfolded portion 13 arranged at intervals. The rotating component 101 is disposed on both of the folded portions 10, and the display device 1 can be folded in a Z-shaped by the rotating component 101, but not limited herein.

The display device 1 is in a folded form combining an inward folding type and an outward folding type, wherein the light-blocking component 300 is disposed between the two adjacent unfolded portions (such as 12 and 13) of the inward folding type. A design of the light-blocking component 300 is equal to the light-blocking component 300 in the above first foldable automotive display device, which will not describe details herein.

Figure 4:
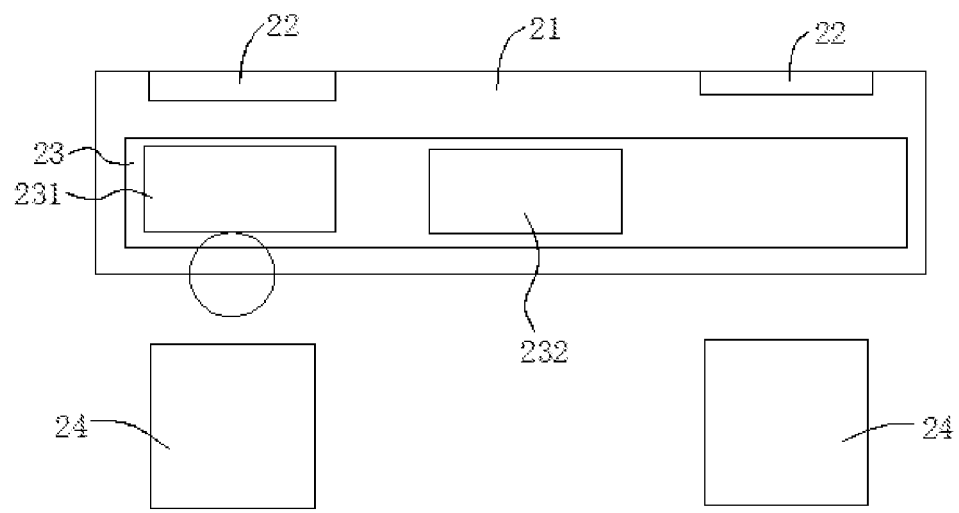
FIG. 4 is a schematic partial diagram of an interior of the vehicle with the foldable automotive display device in the present disclosure.

As shown in FIG. 4, FIG. 4 is a schematic partial diagram of an interior of the vehicle with the foldable automotive display device in the present disclosure. The interior of the vehicle comprises a front window 21, a sun visor 22, a console 23, and a seat 24, wherein the console 23 comprises a center console 231 and a navigation console 232. The display device 1 may be disposed on the console 23; for example, located at a position of the center console 231, and may be used as a display for automobile instruments; the display device 1 may also be located at a position of the navigation console 232, or may be located at various other positions in the vehicle, which is not limited herein.

In the present disclosure, on the one hand, foldable OLED display screens are applied in automotive display, and a display effect of the automotive display is improved compared to traditional foldable liquid crystal display (LCD) display screens. On the other hand, the light-blocking component is disposed in the foldable automotive display device in the present disclosure, which can effectively block external light from irradiating a display region of the display device, and effectively prevent the display effect of the display device from adverse effects caused by the external light, thereby improving the display effect of the automotive display.

The foldable automotive display device of the present disclosure will be described in detail below in conjunction with specific embodiments.

Embodiment 1

Figure 5:
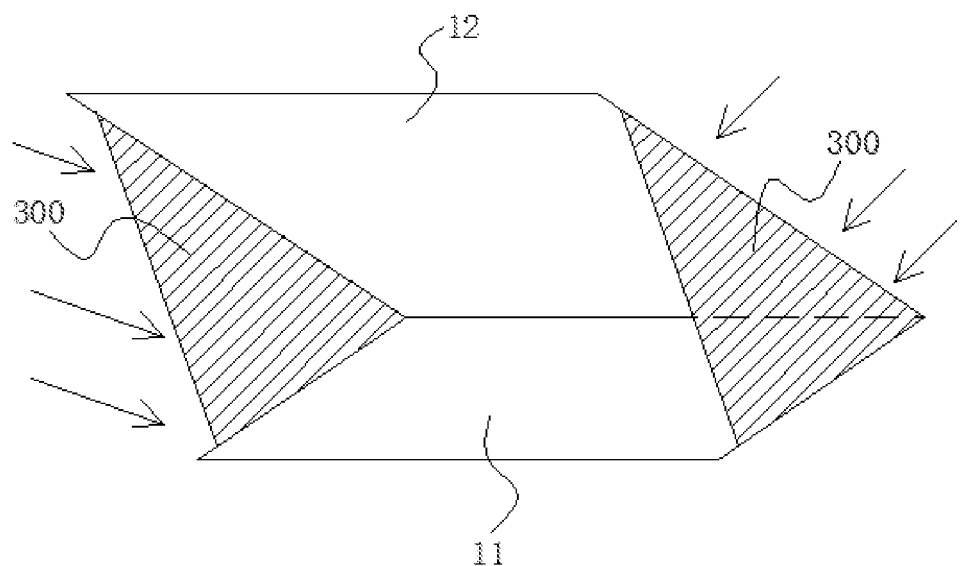
FIG. 5 is a three-dimensional view of an unfolded state of the display device provided by an embodiment 1 of the present disclosure.

Refer to FIG. 2 to FIG. 5, the first foldable automotive display device provided by the present disclosure will be used as an example for description herein. In ordinary driving, people need to sit and hold a steering wheel. When the vehicle is started, the display device will change from the folded state to the unfolded state. As shown in FIG. 5, the display device is partially expanded (an angle of expansion is less than 180°), wherein the first unfolded portion 11 is used for being fixed on the carriage, and the second unfolded portion 12 rotates around the rotating component 101 by the rotating component 101.

The display device 1 is located in-front of the center console. The display device 1 may be the inward folding type, which shows a folded state when not in use, and can prevent dust from entering a surface of the display screen in the folded state. When the vehicle is started, the display device 1 will be in an open state, and an opening angle varies with the driving mode.

The display device 1 can be switched between a large screen and a small screen. When the display screen 200 corresponding to one of the first unfolded portion 11 or the second unfolded portion 12 is used for display, it is in a small screen state; and when the display screen 200 corresponding to the first unfolded portion 11 and the second unfolded portion 12 is used for display, it is in a large screen state.

When an angle between the first unfolded portion 11 and the second unfolded portion 12 is less than 180°, since the second unfolded portion 12 is not fully unfolded, the second unfolded portion 12 can block a part of light incident from the front window, and the light-blocking component 300 on the sides can simultaneously block light incident on sides (as shown by arrows in the figure). Therefore, adopting such method can yield a good driving experience, and effectively prevent the display effect of the display device 1 from adverse effects caused by the external light, thereby improving the display effect of the automotive display.

For an unfolded state of a second foldable automotive display device provided by the present disclosure, reference may be made to the unfolded state of the first foldable automotive display device, and details are not described herein.

Embodiment 2

Figure 6:
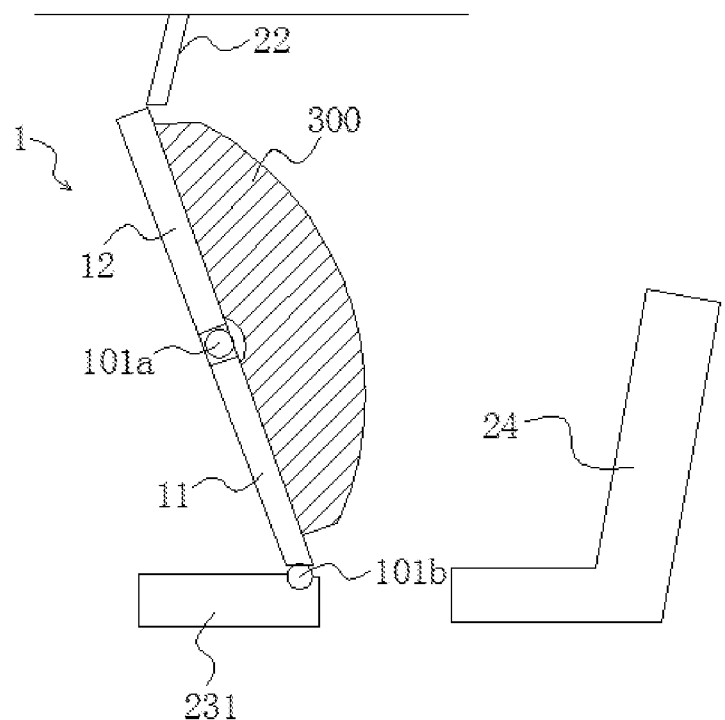
FIG. 6 is a side view of the unfolded state of the display device provided by an embodiment 2 of the present disclosure.

When the vehicle is in an automatic driving mode, people can lie in the front seat. When the vehicle is started, the display device 1 will change from the folded state to a fully unfolded state (the angle of expansion is equal to 180°), so that a driver can watch a larger display screen. As shown in FIG. 6, the display device 1 comprises two rotating components arranged in parallel, a first rotating component 101a is located between the first unfolded portion 11 and the second unfolded portion 12, a second rotating component 101b is located on a side of the first unfolded portion 11 away from the second unfolded portion 12, and the display device 1 is rotatably connected to the center console 231 of the carriage by the second rotating component 101b.

When the vehicle is in the automatic driving mode, the seat 24 can be adjusted to the rear, and a person can lie back on the seat 24. Since quality of viewing images will be different as a lying angle of the person is different, the display device 1 in the fully unfolded state can be rotated along the second rotating component 101b to adjust an angle between the display device 1 and the center console 231. Therefore, the unfolded display device 1 can be adjusted according to the lying angle of the person, so that the person can get the best visual experience.

Combined with FIG. 5 and FIG. 6, the display device 1 is disposed on the center console 231 and located under the sun visor 22, and when the display device 1 is in the unfolded state, the sun visor 22 is configured to splice with the display device 1 by turning over. Since the second unfolded portion 12 is fully unfolded and cannot block light incident from the front window, the sun visor 22 in an upper portion of the carriage is opened and spliced with the unfolded display device 1 to block the light incident from the front window. Meanwhile, the light-blocking component 300 disposed on the edges of the both sides of the display device 1 can block the light incident on the sides, thereby effectively preventing the display effect of the display device from adverse effects caused by the external light, and improving the display effect of the automotive display.

Figure 7:
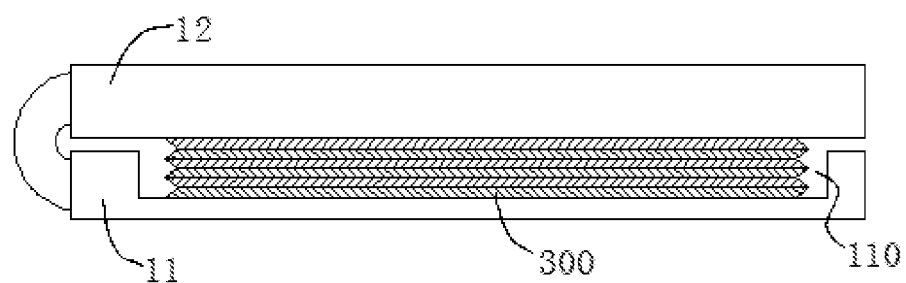
FIG. 7 is a first schematic structural diagram of a light-emitting component provided by an embodiment of the present disclosure.

As shown in FIG. 7, FIG. 7 is an example of a first foldable automotive display device of the present disclosure. A storage groove 110 is defined on both sides of the first unfolded portion 11 comprising the light-blocking component 300. When the display device 1 is in a folded state, the light-blocking component 300 is stored in the storage groove 110, so as not to increase a thickness of the display device 1; and when the display device 1 is in an unfolded state, the light-blocking component 300 is pulled out from the storage groove 110.

Wherein, the light-blocking component 300 may be a light-blocking net or a light-blocking plate. The light-blocking component 300 shown in the figure is a Z-shaped folded structure which is similar to a folding-fan structure. One end of the light-blocking component 300 is fixed on a bottom of the storage groove 110, and another end is fixed on the second unfolded portion 12. The light-blocking component 300 unfolds as the display device 1 unfolds, or folds as the display device 1 folds.

Figure 8:
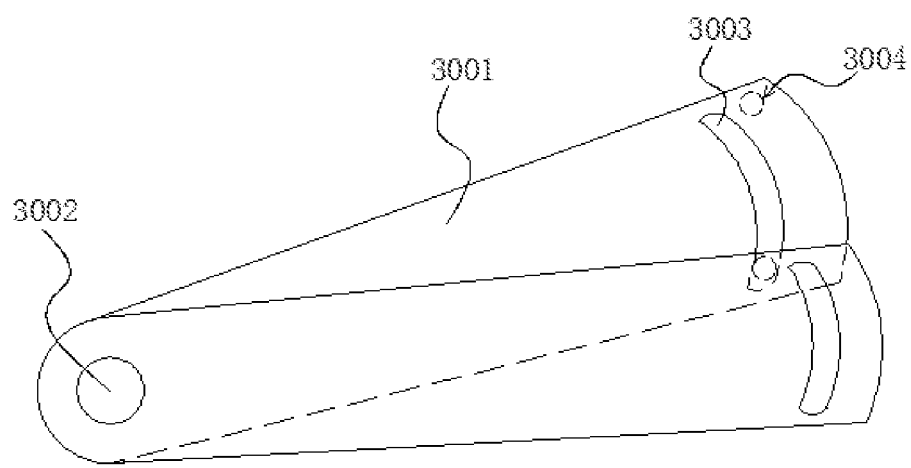
FIG. 8 is a second schematic structural diagram of the light-emitting component provided by the embodiment of the present disclosure.

As shown in FIG. 8, in another embodiment, a structure of the first unfolded portion 11 of the display device 1 is the same as the structure shown in FIG. 7, and the storage groove 110 is also defined for storing the light-blocking component 300. The light-blocking component 300 may be a sliding folded structure which comprises a plurality light-blocking plates 3001 being slid and connected with one another. One end of the light-blocking plate 3001 close to the folded portion 10 of the display device 1 is rotatably connected to by a rotating shaft 3002, and a chute 3003 and a protrusion 3004 are respectively disposed on two surfaces of another end of the light-blocking plate 3001 away from the folded portion 10. One protrusion 3004 of the light-blocking plate 3001 is embedded in the chute 3003 of the adjacent light-blocking plate 3001 to realize a sliding connection. Wherein, the light-blocking component 300 unfolds as the display device 1 unfolds, or folds as the display device 1 folds.

Moreover, the light-blocking component 300 may be a telescopic folded structure, and the light-blocking component 300 unfolds as the display device 1 unfolds, or folds as the display device 1 folds.

Refer to FIG. 1, the present disclosure further provides a vehicle comprising the above foldable automotive display device, wherein the above foldable automotive display device is shown in FIG. 2 to FIG. 8, and details are not described herein.

The present disclosure provides the foldable automotive display device and the vehicle. On the one hand, foldable OLED display screens are applied in the automotive display, and the display effect of the automotive display is improved compared to traditional foldable LCD display screens. On the other hand, the light-blocking component is disposed in the foldable automotive display device in the present disclosure, which can effectively block the external light from irradiating the display region of the display device, and effectively prevent the display effect of the display device from adverse effects caused by the external light, thereby improving the display effect of the automotive display.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. A foldable automotive display device, the display device being fixable in a carriage and comprising a foldable portion, a first non-foldable portion, a second non-foldable unfolded portion, and two light-blocking components,
   wherein a first shaft is disposed in the foldable portion and extends in a first direction;
   each of the first non-foldable portion and the second non-foldable portion is rotatably connected with the first shaft;
   the first non-foldable portion is attachable to the carriage, and the second non-foldable portion is rotatable around the first shaft to enable the display device to fold/unfold in a second direction perpendicular to the first direction;
   the two light-blocking components are disposed respectively on opposite sides of the first shaft in the first direction; and
   opposite ends of each of the two light-blocking components in the second direction are connected respectively to the first non-foldable portion and the second non-foldable portion to enable each of the two light-blocking components to fold/unfold as the display device folds/unfolds.

2. The foldable automotive display device as claimed in claim 1, wherein the display device further comprises a second shaft arranged in parallel with the first shaft, the second shaft is located on a side of the first non-foldable portion away from the second non-foldable portion, and the display device is capable of being rotatably connected to the carriage by the second shaft.

3. The foldable automotive display device as claimed in claim 1, wherein two storage grooves for storing the two light-blocking components respectively are defined on opposite sides of the first non-foldable portion in the first direction, respectively;
   when the display device is in a folded state, the two light-blocking components are stored in the two storage grooves, respectively; and
   when the display device is in an unfolded state, the two light-blocking components are pulled out from the two storage grooves, respectively.

4. The foldable automotive display device as claimed in claim 3, wherein each of the two light-blocking components is a light-blocking net or a light-blocking plate.

5. The foldable automotive display device as claimed in claim 3, wherein each of the two light-blocking components is a Z-shaped foldable structure, a sliding foldable structure, or a telescopic foldable structure.

6. The foldable automotive display device as claimed in claim 1, wherein the carriage comprises a console and a sun visor, the display device is capable of being disposed on the console and located under the sun visor to enable the sun visor to splice with the display device by turning over when the display device is in an unfolded state.

7. A vehicle, comprising the foldable automotive display device as claimed in claim 1.

8. A foldable automotive display device, the display device being fixable in a carriage and the display device comprising a foldable portion, a first non-foldable portion, a second non-foldable portion, and two light-blocking components;

wherein a first shaft is disposed in the foldable portion and extends in a first direction;

each of the first non-foldable portion and the second non-foldable portion is rotatably connected with the first shaft;

the first non-foldable portion is attachable to the carriage, and the second non-foldable portion is rotatable around the first shaft to enable the display device to fold/unfold in a second direction perpendicular to the first direction;

the two light-blocking components are disposed respectively on opposite sides of the first shaft in the first direction; and opposite ends of each of the two light-blocking components in the second direction are connected respectively to the first non-foldable portion and the second non-foldable portion to enable each of the two light-blocking components to fold/unfold as the display device folds/unfolds; and wherein the display device comprises a display screen disposed on the portion, the first non-foldable portion and the second non-foldable portion.

9. The foldable automotive display device as claimed in claim 8, wherein the display device further comprises a second shaft arranged in parallel with the first shaft, the second shaft is located on a side of the first non-foldable portion away from the second non-foldable portion, and the display device is capable of being rotatably connected to the carriage by the second shaft.

10. The foldable automotive display device as claimed in claim 8, wherein two storage grooves for storing the two light-blocking components respectively are defined on opposite sides of the first non-foldable portion in the first direction, respectively;

when the display device is in a folded state, the two light-blocking components are stored in the two storage grooves, respectively; and when the display device is in an unfolded state, the two light-blocking components are pulled out from the two storage grooves, respectively.

11. The foldable automotive display device as claimed in claim 10, wherein each of the two light-blocking components is a light-blocking net or a light-blocking plate.

12. The foldable automotive display device as claimed in claim 10, wherein each of the two light-blocking components is a Z-shaped foldable structure, a sliding foldable structure, or a telescopic foldable structure.

13. The foldable automotive display device as claimed in claim 8, wherein the carriage comprises a console and a sun visor, the display device is capable of being disposed on the console and located under the sun visor to enable the sun visor to splice with the display device by turning over when the display device is in an unfolded state.

* * * * *